(12) United States Patent
Omori

(10) Patent No.: US 7,037,747 B2
(45) Date of Patent: May 2, 2006

(54) METHOD OF MANUFACTURING OPTICAL DEVICE

(75) Inventor: Osamu Omori, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 92 days.

(21) Appl. No.: 10/766,915

(22) Filed: Jan. 30, 2004

(65) Prior Publication Data

US 2004/0258346 A1    Dec. 23, 2004

(30) Foreign Application Priority Data

Feb. 7, 2003 (JP) .............................. 2003-030948

(51) Int. Cl.
*H01L 27/14* (2006.01)

(52) U.S. Cl. ........................................ 438/67; 264/1.36
(58) Field of Classification Search ................. 438/67; 264/1.36, 2.7
See application file for complete search history.

(56) References Cited

U.S. PATENT DOCUMENTS

2003/0124762 A1* 7/2003 Hashimoto ................... 438/67

FOREIGN PATENT DOCUMENTS

| JP | A 2001-128072 | 5/2001 |
|----|---------------|--------|
| JP | A 2003-197656 | 7/2003 |
| JP | A 2003-197885 | 7/2003 |
| JP | A 2003-197927 | 7/2003 |
| JP | A 2003-198897 | 7/2003 |

* cited by examiner

*Primary Examiner*—Hung Xuan Dang
(74) *Attorney, Agent, or Firm*—Oliff & Berridge, PLC

(57) ABSTRACT

A method of manufacturing an optical device including: on at least one of a light transmitting first substrate and a second substrate which includes a first optical element having a first optical portion and a second optical element having a second optical portion, forming a first spacer in a form to surround the first optical portion, and then forming a second spacer in a form to surround the second optical portion; sealing the first and second optical portions with the first substrate and the first and second spacers by connecting the first substrate to the second substrate with the first and second spacers interposed; and cutting the second substrate to separate the first and second optical elements respectively having the first and second sealed optical portions.

58 Claims, 12 Drawing Sheets

METHOD OF MANUFACTURING OPTICAL DEVICE

Japanese Patent Application No. 2003-30948, filed on Feb. 7, 2003 is hereby incorporated by reference in its entirety.

BACKGROUND OF THE INVENTION

The present invention relates to a method of manufacturing an optical device.

For an optical element having an optical portion such as a photoreceptor or the like, it is known to be advantageous to provide a space between the surface having the optical portion and a cover for sealing. Therefore, the method of manufacturing an optical device is known in which, after cutting the optical elements into individual elements, the optical portion is sealed by a cover, with a space provided between the optical portion and the cover. When a wafer or similar substrate is cut, cutting waste and similar is generated. If the sealing is carried out with contamination such as this cutting waste still adhering to the optical portion, it will not be possible later to remove this contamination from within the space, resulting in the problem of reduced quality of the optical device. In particular, in the case of a solid state imaging device with a microlens attached to the optical portion, since the microlens is not flat, contamination adheres more easily, and complete removal is problematic. Therefore, in the case that a microlens is attached to the optical portion, there is the problem of further deterioration in the quality of the solid state imaging device.

BRIEF SUMMARY OF THE INVENTION

According to one aspect of the present invention, there is provided a method of manufacturing an optical device comprising:

(a) on at least one of a light transmitting first substrate and a second substrate which includes a first optical element having a first optical portion and a second optical element having a second optical portion, forming a first spacer in a form to surround the first optical portion, and then forming a second spacer in a form to surround the second optical portion;

(b) sealing the first and second optical portions with the first substrate and the first and second spacers by connecting the first substrate to the second substrate with the first and second spacers interposed; and (c) cutting the second substrate to separate the first and second optical elements respectively having the first and second sealed optical portions.

According to another aspect of the present invention, there is provided a method of manufacturing an optical device comprising:

(a) on at least one of a light transmitting first substrate and a second substrate which includes a plurality of optical elements each having an optical portion, forming a plurality of spacers in a form to respectively surround the optical portions by ejecting a material;

(b) sealing the optical portions with the first substrate and the spacers by connecting the first substrate to the second substrate with the spacers interposed; and (c) cutting the second substrate to separate the optical elements respectively having the sealed optical portions.

According to a further aspect of the present invention, there is provided a method of manufacturing an optical device comprising:

(a) on at least one of a light transmitting first substrate and a second substrate which includes a plurality of optical elements each having an optical portion, forming a plurality of spacers in a form to respectively surround the optical portions by adhering a plurality of sheets;

(b) sealing the optical portions with the first substrate and the spacers by connecting the first substrate to the second substrate with the spacers interposed; and (c) cutting the second substrate to separate the optical elements respectively having the sealed optical portions.

DETAILED DESCRIPTION OF THE EMBODIMENTS

Figure 1A:
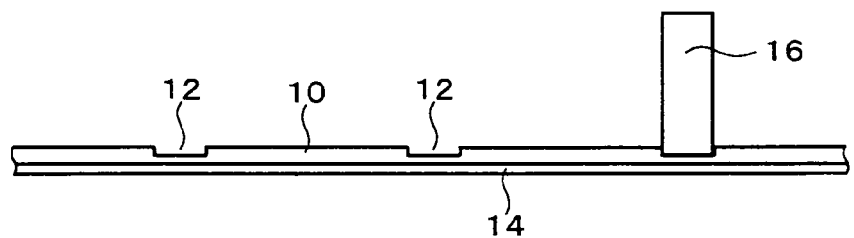
FIGS. 1A to 1C are diagrams for illustrating a method of manufacturing an optical device according to a first embodiment of the present invention.

The embodiments of the present invention may provides a method of manufacturing an optical device of high quality.

(1) According to one embodiment of the present invention, there is provided a method of manufacturing an optical device comprising:

(a) on at least one of a light transmitting first substrate and a second substrate which includes a first optical element having a first optical portion and a second optical element having a second optical portion, forming a first spacer in a form to surround the first optical portion, and then forming a second spacer in a form to surround the second optical portion;

(b) sealing the first and second optical portions with the first substrate and the first and second spacers by connecting the first substrate to the second substrate with the first and second spacers interposed; and (c) cutting the second substrate to separate the first and second optical elements respectively having the first and second sealed optical portions.

Since the second substrate is cut after sealing the first and second optical portions of the second substrate, contaminants, fluff or the like are less likely to adhere to the first and second optical portions. By means of this, contaminants entered the sealed portion can be reduced, and an optical device of high quality can be obtained. By forming the first and second spacers in different steps, the manufacturing process is stabilized, and the yield can be increased.

(2) According to another embodiment of the present invention, there is provided a method of manufacturing an optical device comprising:

(a) on at least one of a light transmitting first substrate and a second substrate which includes a plurality of optical elements each having an optical portion, forming a plurality of spacers in a form to respectively surround the optical portions by ejecting a material;

(b) sealing the optical portions with the first substrate and the spacers by connecting the first substrate to the second substrate with the spacers interposed; and (c) cutting the second substrate to separate the optical elements respectively having the sealed optical portions.

Since the second substrate is cut after sealing the optical portions of the second substrate, contaminants, fluff or the like are less likely to adhere to the optical portions. By means of this, contaminants entered the sealed portion can be reduced, and an optical device of high quality can be obtained.

(3) In this method of manufacturing an optical device, the material may be ejected by a dispenser in the step (a).

(4) In this method of manufacturing an optical device, the step (a) may include revolving a nozzle of the dispenser from a start point to an end point so as to surround each of the optical portions; and of the material, a first portion provided at the start point and a second portion provided at the end point may be spaced apart.

This make it possible to spread the material at the spaced points and to satisfactorily form the first and second spacers in a form to surround each of the first and second optical portions when the first and second substrates are connected with the first and second spacers interposed.

(5) In this method of manufacturing an optical device, the material may be ejected by an inkjet method.

(6) In this method of manufacturing an optical device, the spacers may include a first spacer and a second spacer; and the first spacer may be formed at first, and then the second spacer is formed in the step (a).

(7) In this method of manufacturing an optical device, the spacers may be formed in a single operation with at least one of the first and second substrates in the step (a). This enables to form the plurality of spacers in a single operation, leading to the increased productivity.

(8) According to a further embodiment of the present invention, there is provided a method of manufacturing an optical device comprising:

(a) on at least one of a light transmitting first substrate and a second substrate which includes a plurality of optical elements each having an optical portion, forming a plurality of spacers in a form to respectively surround the optical portions by adhering a plurality of sheets;

(b) sealing the optical portions with the first substrate and the spacers by connecting the first substrate to the second substrate with the spacers interposed; and (c) cutting the second substrate to separate the optical elements respectively having the sealed optical portions.

Since a sheet is used, the form of the spacers can be assured, and particularly the spacer height can be made constant, so the first and second substrates can be supported so as to be mutually parallel.

(9) In this method of manufacturing an optical device, the sheets may be fixed to a third substrate; and the step (a) may include transferring the sheets from the third substrate to the first or second substrate. This makes it possible to provided the sheets on the required substrate in a single operation.

(10) In this method of manufacturing an optical device, the third substrate may be a light curing tape.

(11) This method of manufacturing an optical device, may further comprise cutting the first substrate in the step (c), wherein the first substrate may be cut by a first cutter, and the second substrate is cut by a second cutter.

(12) In this method of manufacturing an optical device, the width of the first cutter may be larger than the width of the second cutter. This makes the width of the cutting region of the first substrate larger than the width of the cutting region of the second substrate.

(13) In this method of manufacturing an optical device, the optical elements may have electrodes on the outside of the optical portions; and part of the first substrate located above the electrodes may be removed by cutting the first substrate in the step (c). Since the space over the electrodes on the first substrate is open, electrical connection to the electrodes can be carried out more easily.

(14) In this method of manufacturing an optical device, the first substrate may have a groove; and the first substrate may be cut along the groove in the step (c). When the first substrate is cut along the groove, the thickness of the portion is less than the thickness of other portions, so damage is less likely to be caused to the second substrate. The cutting position of the first substrate can also be marked. Compared with cutting a portion in which no groove is formed, the first substrate can be cut without the extremity of the first cutter being close to the second substrate.

(15) In this method of manufacturing an optical device, each of the spacers may have a thermosetting resin; and the first and second substrates may be connected by heating the spacers in the step (b).

(16) In this method of manufacturing an optical device, the spacers may be heated at a first temperature in the step (b); and the thermosetting resins may be preliminarily cured by heating the spacers at a second temperature which is lower than the first temperature before the step (b).

(17) In this method of manufacturing an optical device, each of the spacers may have a light curing resin; and the first and second substrates may be connected by irradiating the spacers with light in the step (b).

(18) In this method of manufacturing an optical device, the spacers may be irradiated with light having a first energy in the step (b); and the light curing resins may be preliminarily cured by irradiating the spacers with light having a second energy which is lower than the first energy before the step (b).

(19) In this method of manufacturing an optical device, the spacers may be formed of a metal; and the spacers may be soldered by the metal in the step (b).

(20) In this method of manufacturing an optical device, a soldering material may be provided on a position on one of the first and second substrates opposite to the other of the first and second substrates to which one of the spacers is attached, before carrying out the soldering.

(21) In this method of manufacturing an optical device, the optical portions may be sealed so that a space is formed between the first substrate and the optical portions in the step (b).

(22) In this method of manufacturing an optical device, the optical portions may be sealed so that air in the space is evacuated in the step (b).

(23) In this method of manufacturing an optical device, the optical portion may be sealed so that the space is filled with nitrogen in the step (b).

(24) In this method of manufacturing an optical device, the optical portion may be sealed so that the space is filled with dry air in the step (b).

(25) In this method of manufacturing an optical device, the first substrate may transmit at least visible light, and not transmit infrared.

(26) In this method of manufacturing an optical device, the second substrate may be a semiconductor wafer.

The embodiments of the present invention are now described with reference to the drawings.

First Embodiment

FIGS. 1A to 5B illustrate a first embodiment of the optical device and method of manufacture thereof of the present invention. In this embodiment, first and second substrates 10 and 20 are used.

As shown in FIG. 1A, the first substrate 10 is provided. The size and form of the first substrate 10 is not particularly restricted, but it is preferably of the same size as the second substrate 20, and even more preferably of the same form as the second substrate 20. Furthermore, as shown in for example FIG. 3, it may be quadrilateral. The first substrate 10 is light transmitting. As the first substrate 10 can be used optical glass. As long as the first substrate 10 permits light to pass, the magnitude of losses is not important, or it may pass light of only particular wavelengths. For example, the first substrate 10 may be such as to pass visible light, but block light in the infrared region. The first substrate 10 may have small losses with respect to visible light, but large losses with respect to light in the infrared region. Furthermore, on the surface of the first substrate 10 may be formed an anti-reflective film, infrared blocking film, or other optically active film. In this way, since no optically active element other than the substrate need be provided, the optical device can be made even more compact.

Figure 3:
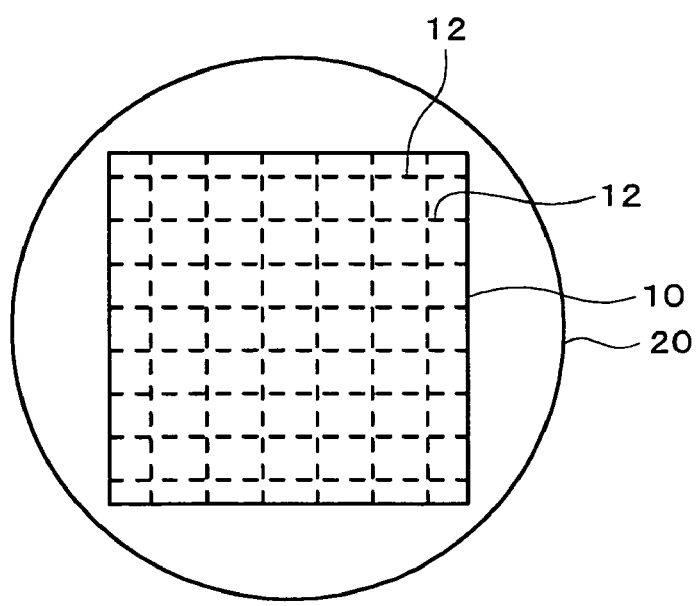
FIG. 3 is a diagram for illustrating the method of manufacturing an optical device according to the first embodiment of the present invention.

As shown in FIG. 1A, in the first substrate 10 a groove 12 may be provided. If the groove 12 is formed by cutting the first substrate 10, then applying a supporting material such as a sheet 14 to the first substrate 10 will be easier to work, and cracking of the first substrate 10 can be prevented. The groove 12 may be formed by half-cutting the first substrate 10. This "half-cut" refers to not completely cutting the first substrate 10, but as shown in FIG. 1A, carrying out a machining operation to provide a groove. In that case, the formation of the groove 12 may be carried out using a blade 16. The groove 12 is formed on a cutting line of the first substrate 10. For example, as shown in FIG. 3, a plurality of grooves 12 may be formed, so as to form a grid. As a variant, the first substrate 10 may have no groove 12. As another variant, the first substrate 10 may be already separated into individual transparent substrate portions, and a plurality of the transparent substrate portions supported by a sheet 14 or similar supporting material.

Figure 1B:
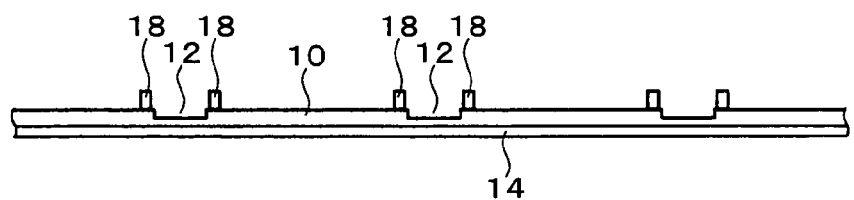

Next, on at least one of the first and second substrates 10 and 20, a plurality of spacers 18 is formed. The plurality of spacers 18 may, as shown in FIG. 1 be formed on the first substrate 10, or may be formed on the second substrate 20, or may be formed on both of the first and second substrates 10 and 20. Each of the spacers 18, is formed substantially to surround an optical portion 22 described hereinafter. As one example, as shown in FIG. 1B, the spacer 18 may be formed as a frame completely surrounding the optical portion 22 (see FIG. 5B). Alternatively, a spacer 18 may be formed as an intermittent part of a frame, surrounding the optical portion 22 (see FIG. 8 described below). The spacers 18 are provided in portions where the first substrate 10 will be cut into separate transparent substrate pieces 110. In the example shown in FIG. 1B, the spacers 18 are formed in the portions (see FIG. 3) surrounded by the groove 12. Thereafter, the first and second substrates 10 and 20 are attached to each other with at least one spacer 18 interposed.

In this embodiment, the plural spacers 18 are individually formed for each optical element 100 described hereinafter. That is to say, when the optical element 100 includes a first optical element including a first optical portion and a second optical element including a second optical portion, a spacer is formed in a form surrounding the first optical portion, and thereafter a second spacer is formed in a form surrounding the second optical portion. In this case, the spacers 18 may be formed respectively for the optical portions, or the spacers 18 surrounding the optical portions may be formed in a single operation. As shown in FIG. 1B, when forming a plurality of spacers 18 on the first substrate 10, each individual spacer 18 is formed in the portion corresponding to the optical element 100 on the first substrate 10 (the portion surrounded by the groove 12). In that case, it is preferable that positioning marks (not shown in the drawings) formed on the first substrate 10 are recognized, and positioning carried out. This applies similarly in the case that the spacers 18 are formed on the second substrate 20. By forming individual spacers 18, positioning errors can be reduced, formation definitively in the specified position is possible, as a result of which the manufacturing process is made more stable, and the product yield can be increased.

In this embodiment, the spacers 18 are formed of resin. Considering the adhesion between the first and second substrates 10 and 20, a resin having good adhesion, such as a thermoplastic resin, light curing resin, thermosetting resin, or a combination of these may be used. For spacers 18 formed of light curing resin or thermosetting resin, by carrying out preliminary curing deformation thereof can be limited. If the resin of which the above described spacers 18 are formed is the type cured by ultraviolet radiation, then for the preliminary curing, irradiation with weak ultraviolet radiation can be applied. Here, preliminary curing refers to a state in which the resin is not completely cured, but the resin subjected to preliminary curing has a flowability reduced below the flowability of the resin at room temperature. In the case that spacers 18 including a light curing resin are used, by irradiating the spacers 18 with light having a second energy lower than light having a first energy which is irradiated when the spacers 18 are formed on at least one of the first substrate 10 and second substrate 20, the light curing resin can be subjected to preliminary curing. When using spacers 18 including a thermosetting resin, by applying to the spacers 18 heat of a second temperature lower than a temperature (first temperature) of heat which is applied when the spacers 18 are formed on at least one of the first substrate 10 and second substrate 20, the thermosetting resin can be subjected to preliminary curing. By means of this, when the first and second substrates 10 and 20 are attached to each other with the spacers 18 interposed, the resin is less liable to be deformed, and therefore resin can be made less likely to adhere to the optical portion 22 described below. Therefore, obstruction of the ingress or egress of light to the optical portion as a result of adhering resin can be prevented. The spacers 18 are preferably of a material of which at least the surface is insulating.

Figure 1C:
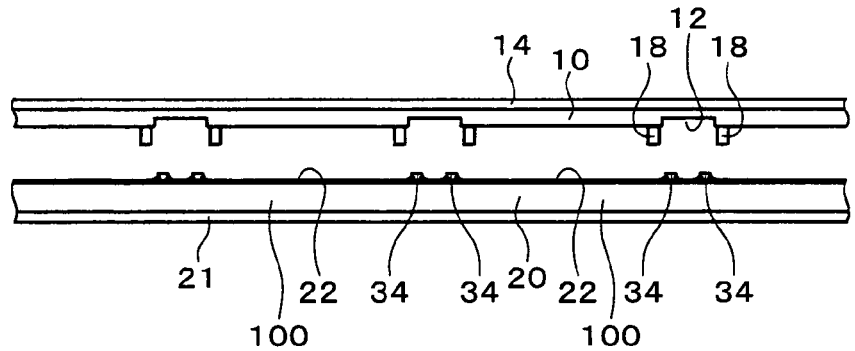
Figure 2:
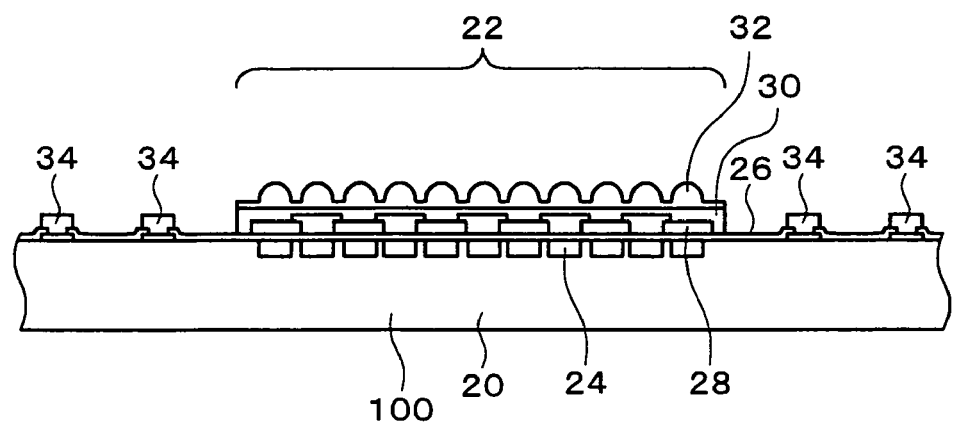
FIG. 2 is a diagram for illustrating the method of manufacturing an optical device according to the first embodiment of the present invention.

As shown in FIG. 1C, a second substrate 20 is provided. To the second substrate 20 may be applied a sheet 21 to improve the workability in a cutting process described hereinafter. FIG. 2 is an enlargement of a portion of the second substrate 20. The second substrate 20 has a plurality of optical elements 100 having optical portions 22. The optical elements 100 include the optical portions 22 and electrodes 34. The optical portion 22 has a portion at which light enters or leaves (a photoreceptor or photoemitter), and a portion which transduces light energy to a different form of energy (for example electrical energy ), or transduces a different form of energy (for example, electrical energy) to light energy. One optical portion 22 may include a plurality of energy transducers (photoreceptors or photoemitters) 24.

In this embodiment, a solid state imaging device (for example a CCD equipped with photodiodes, or an image sensor such as a CMOS sensor) is described by way of example. In this case, each optical portion 22 has a plurality of energy transducers (photoreceptor, image sensor, or similar elements) 24. As shown in FIG. 2, the plurality of energy transducers 24 is arranged two-dimensionally, in a manner for image sensing. The energy transducers 24 may be covered by a light transmitting passivation film 26. If the second substrate 20 includes a semiconductor substrate (for example a semiconductor wafer), the passivation film 26 may be formed of a silicon oxide film or silicon nitride film.

The optical portion 22 may have color filters 28. The color filters 28 may be formed over the passivation film 26. Over the color filters 28 may be provided a flattening layer 30. On the surface of the optical portion 22, a microlens array 32 may be provided. In this case, the first substrate 10 and spacers 18 seal at least the region of the second substrate 20 in which the microlens array 32 is provided.

On the second substrate 20, the plurality of electrodes 34 is formed. The electrodes 34 shown in FIG. 2 have bumps formed over pads, but these may be pads alone. As shown in FIG. 2, the electrodes 34 are preferably formed on the outside of the optical portion 22 of each individual optical element 100. For example, the electrodes 34 may be formed between adjacent optical portions 22. For each optical portion 22 there is a corresponding group of electrodes 34. For example, as shown in FIG. 5B, the electrodes 34 may be disposed along a plurality of edges (for example four edges) of the optical portion 22. The electrodes 34 may be disposed along one edge or a pair of opposite edges of the optical portion 22.

As shown in FIG. 1C, the first and second substrates 10 and 20 are opposed. In more detail, the surface of the second substrate 20 on which the optical portion 22 is formed, and the first substrate 10 are opposed. FIG. 3 is a plan view of the opposed first and second substrates. When the first substrate 10 has a groove 12, the surface with the groove is disposed to face the second substrate 20. When a sheet 14 or similar supporting material is provided on separated first substrates 10, the surface opposite the surface on which the supporting material is provided is disposed to face the second substrate. At this point, the spacers 18 are interposed between the first and second substrates 10 and 20. The spacers 18 are disposed to surround the optical portion 22 of the second substrate 20 (see FIG. 5B).

Figure 4A:
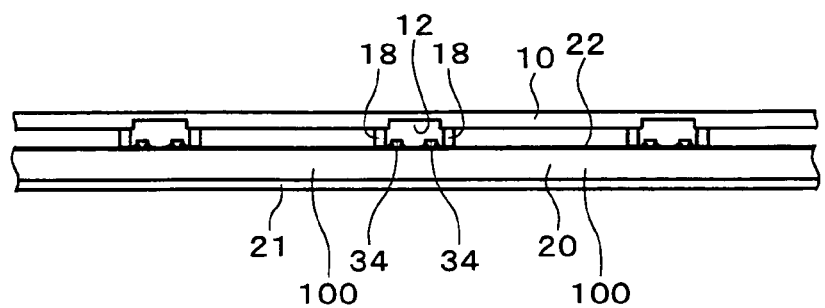
FIGS. 4A to 4C are diagrams for illustrating the method of manufacturing an optical device according to the first embodiment of the present invention.

As shown in FIG. 4A, the first and second substrates 10 and 20 are attached together with the spacers 18 interposed. When for example the spacers 18 are formed of a thermosetting resin, the spacers 18 provided on the first substrate 10 are contacted with the second substrate 20, and heat is applied to the spacers 18 to develop the adhesion force. Alternatively, an adhesive may be provided between the second substrate and the spacers 18. In this way, the optical portion 22 can be sealed by the first substrate 10 and spacers 18. In this embodiment, the optical portion 22 is sealed so that between the first and second substrates 10 and 20 a space is formed. Here, the space may be at less than atmospheric pressure, may be evacuated, or may be filled with nitrogen, dry air or the like. For example, by carrying out the sealing operation at less than atmospheric pressure, in a vacuum, or in an atmosphere of nitrogen, dry air or the like, the above described construction can be achieved. By means of this, water vapor and similar within the space can be reduced, and condensation within the semiconductor device, or electronic components, and damage caused by an increase in internal pressure within the space during an overheating process can be prevented. It should be noted that if required, the sheet 14 is removed from the first substrate 10. Furthermore, immediately before this sealing process, the first and second substrates 10 and 20 are preferably washed and dried. This is because by purifying the optical portion 22 immediately before sealing, contaminants, fluff or the like within the space can be reduced, and the yield of the final product can be further improved.

Figure 4B:
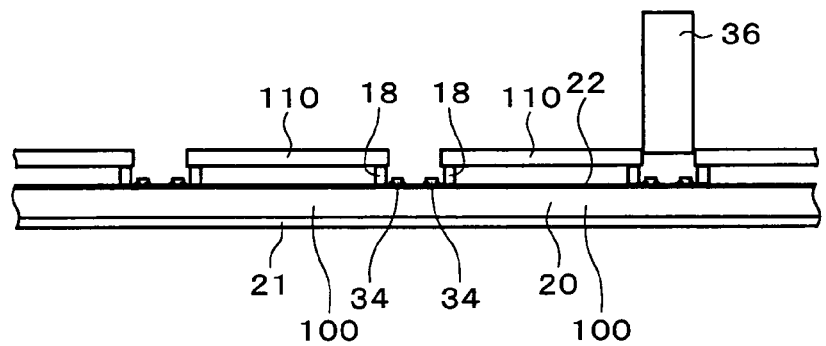

As shown in FIG. 4B, the first substrate 10 is cut into transparent substrate pieces 110. This cutting is carried out so as to avoid the portions of the first substrate 10 to become the transparent substrate pieces 110. That is to say, the first substrate 10 is cut on the outside of the region surrounded by the spacers 18 (where the optical portion 22 is positioned) and on the outside of the spacers 18, or to leave at least a portion of the spacers 18 remaining. In this embodiment, the first substrate 10 is cut along the groove 12.

The cutting line of the first substrate 10 is positioned over the electrodes 34 on the second substrate 20. In a subsequent process, to make electrical connection to the electrodes 34 easier, the portion of the first substrate 10 over the electrodes 34 is removed. For example, as a first cutter 36 for cutting the first substrate 10, a tool for cutting by machining is used. In this way, the space over the electrodes 34 is opened. It should be noted that for the first cutter 36 (for example a blade) is preferably used one having a larger cutting width than the second cutter 38 described hereinafter.

In the example shown in FIG. 4B, the groove 12 is formed by the first cutter 36. This is to reduce the likelihood of damage to the second substrate 20 in the cutting process, and can also be used to mark the cutting position of the first substrate 10. In this embodiment, the state with the groove 12 provided is shown, but without providing the groove 12, the first substrate 10 may be directly cut by the first cutter 36. The width of the first cutter 36 is substantially equal to the width of the groove 12. Here, "substantially equal" includes the case of being exactly equal, and also the case of being equal within an error margin. Alternatively, the width of the first cutter 36 may be less than the width of the groove 12. In that case, since the first substrate 10 is cut within the groove 12, the transparent substrate pieces 110 have stepped extremities formed. Alternatively, the width of the first cutter 36 may be more than the width of the groove 12. Furthermore, the width of the first cutter 36 may be more than the interval between adjacent spacers 18. In that case, when the first substrate 10 is cut, a part of the spacers 18 is cut away.

The cutting of the first substrate 10 is carried out so as not to damage the electrodes 34 or second substrate 20, and particularly the surface of the second substrate 20. In this embodiment, the surface of the first substrate 10 in which the groove 12 is formed faces the electrodes 34. Therefore, since the surface of the first substrate 10 is removed from the electrodes 34 by the depth of the groove 12, it is less likely that the edge of the first cutter 36 will contact the electrodes 34.

Figure 4C:
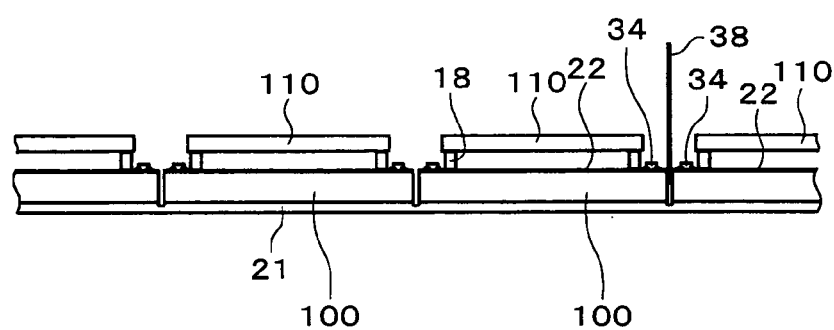

As shown in FIG. 4C, the second substrate 20 is cut, forming individual optical elements 100. The second cutter 38 (for example a blade) used for this cutting may be narrower than the first cutter 36. The second substrate 20 is cut outside the optical portion 22 and further on the outside of the electrodes 34. In the example shown in FIG. 4C, between adjacent optical portions 22, the electrodes 34 for each optical portion 22 are formed, and between these electrodes 34, the second substrate 20 is cut. If a sheet 21 is adhered to the second substrate 20, even when the second substrate 20 is separated into individual optical elements 100, the optical elements 100 do not fall apart. In this way, an optical device sealed by the transparent substrate pieces 110 and spacers 18 is obtained. According to this embodiment, since the second substrate 20 is cut after the optical portion 22 is sealed, no contaminants can enter the seal portion, and an optical device of high quality can be obtained.

Figure 5A:
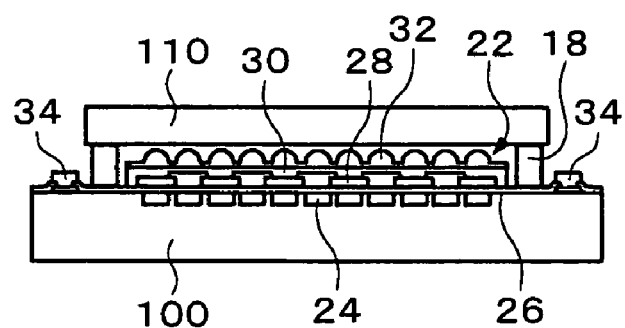
FIGS. 5A and 5B are diagrams for illustrating the optical device according to the first embodiment of the present invention.
Figure 5B:
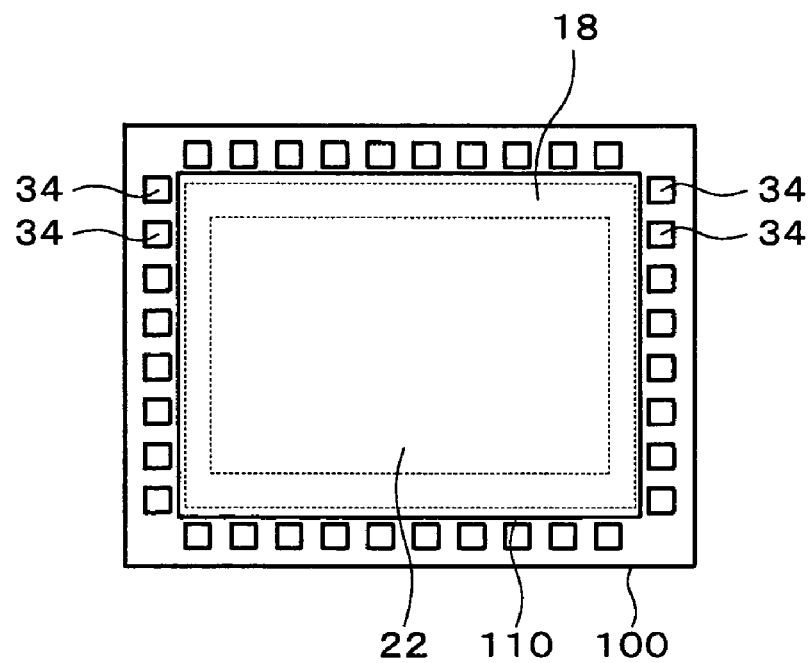

FIGS. 5A and 5B illustrate the first embodiment of the optical device of the present invention. The optical device comprises a transparent substrate piece 110, an optical element 100, and spacers 18. Light enters the optical portion 22 from the transparent substrate piece 110. The optical portion 22 provided in the optical element 100 is sealed by the transparent substrate piece 110 and spacers 18. Between the optical portion 22 and the transparent substrate piece 110 a space is formed. This space may be evacuated, or may be filled with nitrogen or dry air. In this way, condensation on the optical portion 22 does not occur. On the outside of the optical portion 22, and further on the outside of the elements (transparent substrate piece 110 and spacers 18) sealing the optical portion 22, the electrodes 34 are provided on the optical element 100. In respect of other details, the content of the description of the method of manufacturing an optical device above applies.

The present invention is not restricted to the above described embodiment, and various modifications are possible. For example, the present invention includes substantially the same construction as the construction described in the embodiment (for example, a construction for which the function, method, and result are the same, or a construction of which the purpose and result are the same). The present invention includes a construction in which parts which are not of the essence of the construction described in the embodiment are replaced. The present invention includes a construction having the same effect as the construction described in the embodiment or a construction capable of achieving the same purpose. The present invention includes a construction having the construction described in the embodiment to which is added well-known art.

Second Embodiment

FIGS. 6A to 8 illustrate a second embodiment of the method of manufacturing an optical device of the present invention. In this embodiment, the spacers 18 are formed by ejecting a material 200. The material 200 is a material in paste form or liquid form, and has a flowability (or viscosity) such as to allow ejection. The material 200 may be formed of a resin or metal.

Figure 6A:
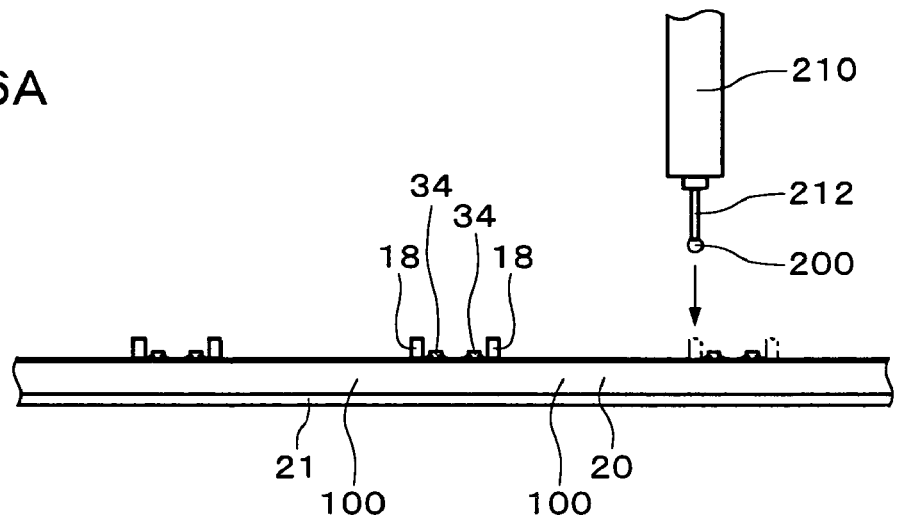
FIGS. 6A and 6B are diagrams for illustrating the method of manufacturing an optical device according to a second embodiment of the present invention.

As shown in FIG. 6A, the material 200 may be ejected using a dispenser 210. In more detail, the dispenser 210 has a nozzle 212, and the material 200 is ejected in drops from the extremity of the nozzle 212. As shown in FIG. 6A, the spacers 18 may be formed on the second substrate 20. If a passivation film is formed on the second substrate 20, the spacers 18 may be formed thereon, or the formation of the passivation film may be avoided in the region of formation of the spacers 18. The dispenser 210 can be handled easily, and therefore the spacers 18 can be formed in a simple process.

Figure 7:
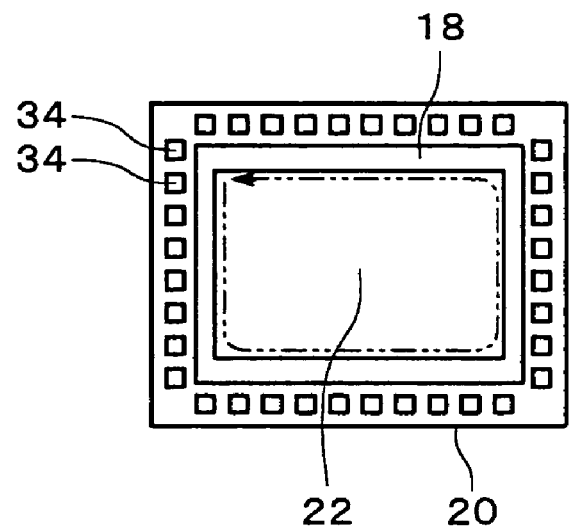
FIG. 7 is a diagram for illustrating the method of manufacturing an optical device according to the second embodiment of the present invention.

When using the dispenser 210, as shown in FIG. 7, the nozzle 212 is revolved (counterclockwise in FIG. 7) about the optical portion 22, from a start point to an end point, to form the spacers 18 as a frame. For example, as shown by the arrow in FIG. 7, a point corresponding to a corner of the optical portion 22 may be used as the start point and end point. The start point and end point may be in coincident positions. By means of this, adjacent portions of the material 200 at the start point and end point can be positively connected, and therefore the spacers 18 can be simply formed as a frame. The material 200 of the spacers 18 may be thicker at the start point and end point than in other portions.

Figure 8:
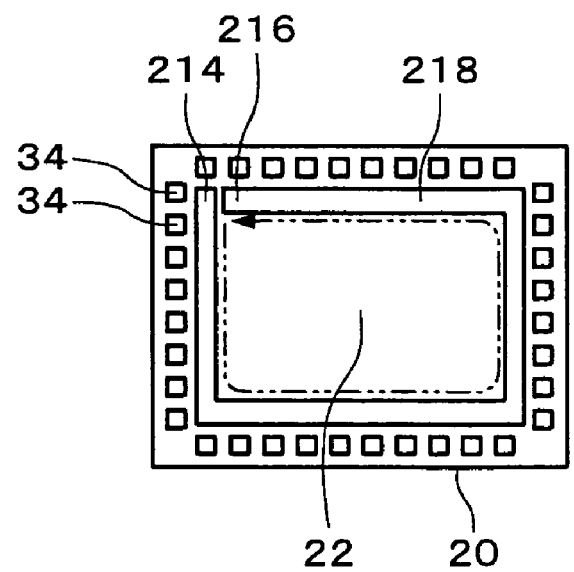
FIG. 8 is a diagram for illustrating a method of manufacturing an optical device according to a modification of the second embodiment the present invention.

As shown in FIG. 8, as a variant embodiment using a dispenser, of the material 200, a first portion 214 provided at the start point, and a second portion provided at the end point may be spaced apart. By means of this, when the first and second substrates 10 and 20 are joined (for example by compression) with a spacer 218 interposed, the material 200 spreads between the first and second portions 214 and 216, and the spacers 18 (see FIG. 5B) can be satisfactorily formed as a frame. That is to say, localized thickening of the spacers 18 can be prevented, and therefore the height of the spacers 18 can be made uniform and the first and second substrates 10 and 20 can be supported so as to be mutually parallel.

As a variant method of forming the spacers, an inkjet technique may be applied, to eject the material 200. In more detail, drops of the material 200 are ejected from an inkjet head (not shown in the drawings). The inkjet head comprises a static electricity actuator construction, more specifically a micro-construction actuator made using ultra-fine working technology by means of micro-machining technology. For such a micro-construction actuator, static electricity is used as the source of drive power. The inkjet head uses static electricity to eject drops of the material 200 from a nozzle (not shown in the drawings). By means of this, technology implemented for inkjet printers can be applied, and the ejection can be carried out rapidly and economically, with no wasted material.

The plurality of spacers 18, as described in the first embodiment, may be formed individually for each optical element 100, or may be formed together, on at least one of the first and second substrates 10 and 20. In the case of forming together using the dispenser 210, a plurality of nozzles 212 is used, and the material 200 is ejected together in the required regions for the plurality of optical elements 100. The same applies to the inkjet method. By means of this, a plurality of spacers 18 can be formed together, and therefore the productivity can be increased.

Figure 6B:
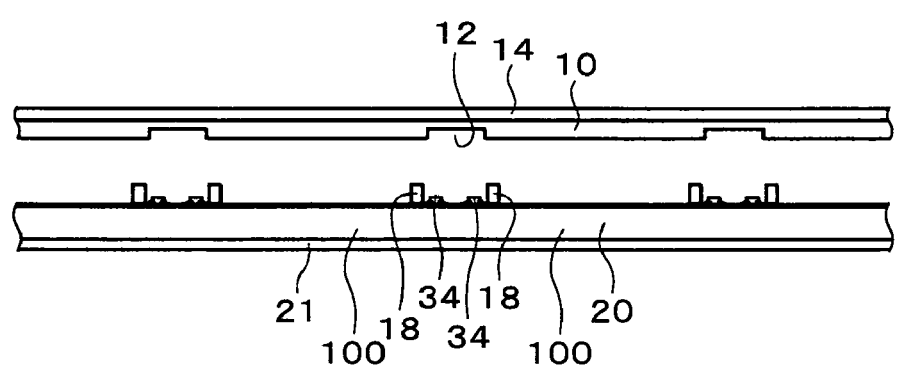

As shown in FIG. 6B, the first substrate 10 is attached to the spacers 18. With regard to the adhesion of the first substrate 10 and the spacers 18, the description in the first embodiment of the adhesion of the second substrate 20 and the spacers 18 can be applied. With regard to other aspects also, the description of the first embodiment applies.

Third Embodiment

Figure 9:
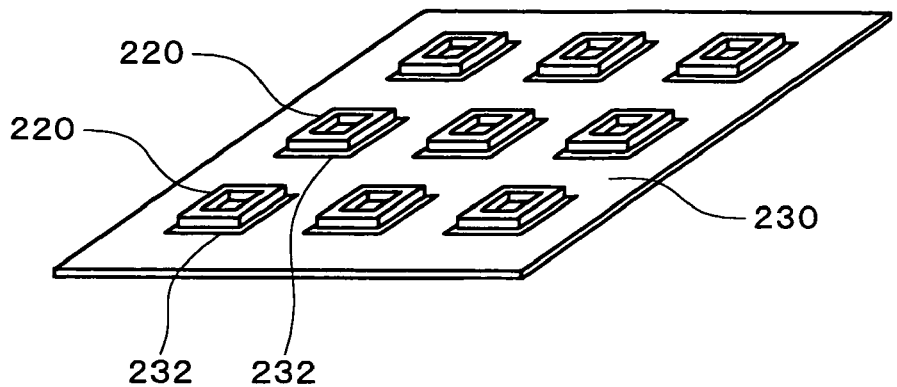
FIG. 9 is a diagram for illustrating the method of manufacturing an optical device according to a third embodiment of the present invention.
Figure 10A:
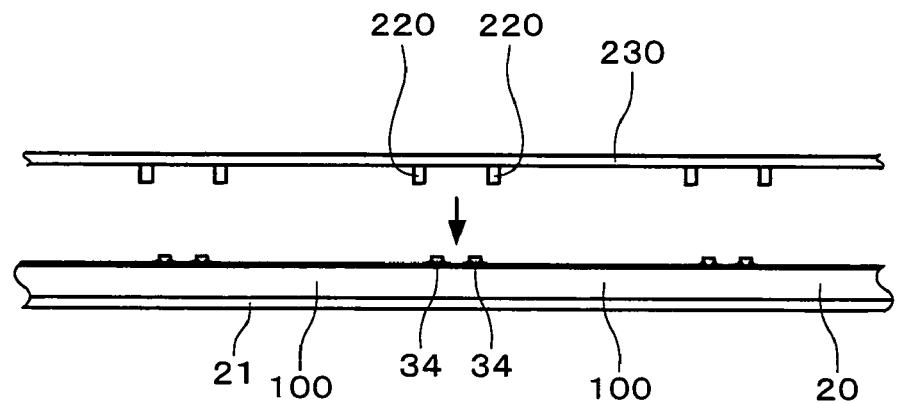
FIGS. 10A and 10B are diagrams for illustrating the method of manufacturing an optical device according to the third embodiment of the present invention.
Figure 10B:
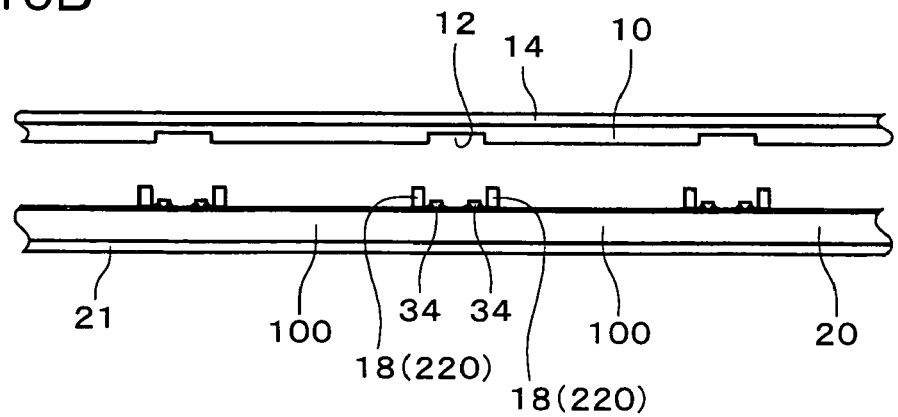
Figure 11A:
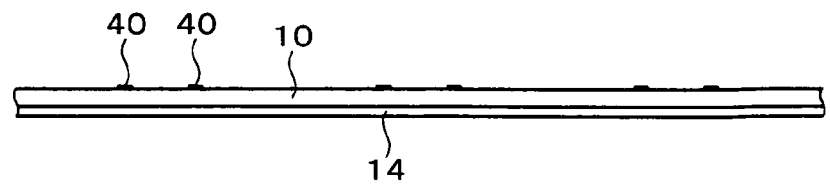
FIGS. 11A to 11E are diagrams for illustrating the method of manufacturing an optical device according to a fourth embodiment of the present invention.
Figure 11B:
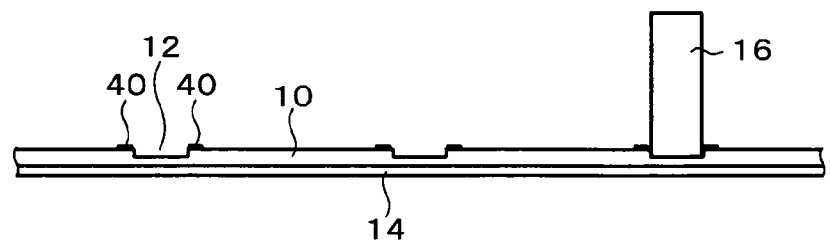
Figure 11C:
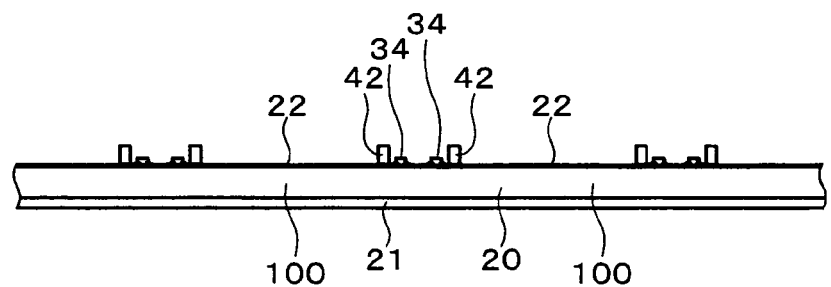
Figure 11D:
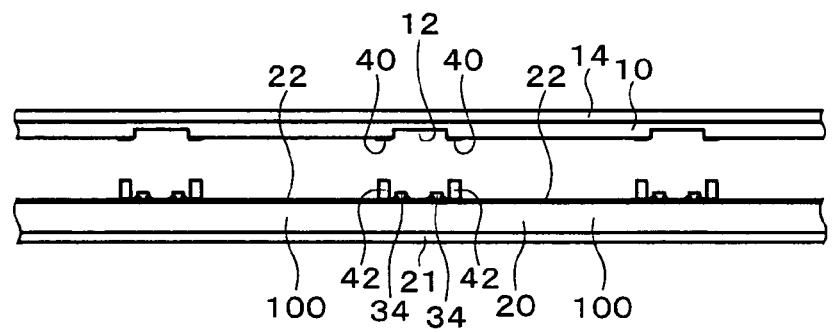
Figure 11E:
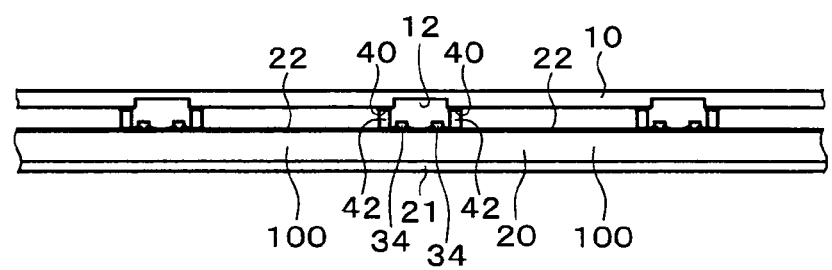

FIGS. 9 to 10B illustrate a third embodiment of the method of manufacturing an optical device of the present invention. In this embodiment, a plurality of sheets 220 of previously determined form (width and height) are adhered, whereby spacers 18 are formed. The sheets 220 may be formed as a frame of a size to surround the optical portion 22. The method of forming the sheets 220 is not limited, but they may be punched out from a substrate material, or may be molded using a die. The sheets 220 may be a solid form resin. The plurality of sheets 220 may be provided on the first or second substrate 10 or 20 by transfer from a third substrate 230. In that case, if the plurality of sheets 220 is transferred in entirety, the plurality of spacers 18 can be formed in a single operation, as a result of which productivity is extremely high, which is desirable.

First, as shown in FIG. 9, the plurality of sheets 220 is arranged on the third substrate 230 (for example in a matrix). The fixing together of the sheets 220 and the third substrate 230 may be achieved by means of an adhesion material 232. Alternatively, if the third substrate 230 itself is adhesive, the sheets 220 may be adhered to the third substrate 230 without interposing an adhesion material. Alternatively, the sheet 220 itself may be adhesive. The third substrate 230 may be a flexible tape (or film), and for example may be light-cured (for example being cured by ultraviolet radiation). By means of this, the presence or absence of the adhesion force can be controlled by irradiating with light, as a result of which the attachment and detachment of the sheets 220 to the third substrate 230 is easy.

Then as shown in FIG. 10A, the third substrate 230 is opposed to, for example, the second substrate 20, and the plurality of sheets 220 is transferred from the third substrate 230 to the second substrate 20. In this case, in the region of the second substrate 20 in which the sheets 220 are provided an adhesion material (not shown in the drawings) may be provided. Alternatively, when the sheets 220 themselves are adhesive, the sheets 220 may be adhered to the second substrate 20 without interposing an adhesion material. In this case, the sheets 220 may be light-cured (for example being cured by ultraviolet radiation). Thereafter, as shown in FIG. 10B, the first substrate 10 is attached to the spacers 18. Other parts of the description are as above.

According to this embodiment, since the sheets 220 are used, the form of the spacers 18 is easily assured, and particularly the height of the spacers 18 can be made constant, and the first and second substrates 10 and 20 can be supported so as to be mutually parallel.

Fourth Embodiment

FIGS. 11A to 11E illustrate a fourth embodiment of the method of manufacturing an optical device of the present invention. In this embodiment, the first and second substrates 10 and 20 described in the first embodiment are used, but the spacer is formed of metal. That is to say, a spacer is formed of metal on either of the first and second substrates 10 and 20, and the spacer is then attached to the other of the first and second substrates 10 and 20. A plurality of spacers may be formed individually for each optical element 100. A metal may be ejected in paste form or liquid form (for example a soldering material), to form the spacer. In respect of these and other aspects, the description of all of the above described embodiments can be selectively applied.

As shown in FIG. 7A, on the first substrate 10 a soldering material (or seal metal) 40 is provided. The soldering material 40 may be either a soft solder or a hard solder. The method of providing the soldering material 40 may be any of vapor deposition, sputtering, CVD, and plating (for example electroless plating). If the soldering material 40 is in paste form, such as a solder paste, then screen printing may be applied. The soldering material 40 is provided in the fixing position of the spacer. This is described in more detail in the first embodiment.

As shown in FIG. 7B, a groove 12 is formed in the first substrate 10. More details of this are also described in the first embodiment. In this embodiment, the groove 12 is formed after providing the soldering material 40, but this sequence may be reversed.

As shown in FIG. 7C, spacers 42 are formed on the second substrate 20. The spacers 42 are formed of a metal such as nickel or gold. As the method of formation thereof, plating (for example electroless plating) can be applied.

As shown in FIG. 7D, the first and second substrates 10 and 20 are attached together with the spacers 42 interposed. In concrete terms, the spacers 42 are bonded to the first substrate 10. For this bonding, soldering is applied. In more detail, the soldering material 40 formed on the first substrate 10 is fused by the application of heat, and the first substrate 10 and spacers 42 are bonded.

As shown in FIG. 7E, the first and second substrates 10 and 20 are attached together, and thereafter, the process shown in FIGS. 4B and 4C is carried out. In the thus obtained optical device, the optical portion 22 is sealed by the transparent substrate piece 110, spacers 42, and soldering material 40.

With regard to other details, the description of the first embodiment applies. As a variant of this embodiment, a metal spacer may be provided on the first substrate 10, and this spacer bonded to the second substrate 20. In this embodiment soldering is applied, but the soldering material may be omitted and an adhesive may be used.

Fifth Embodiment

Figure 12:
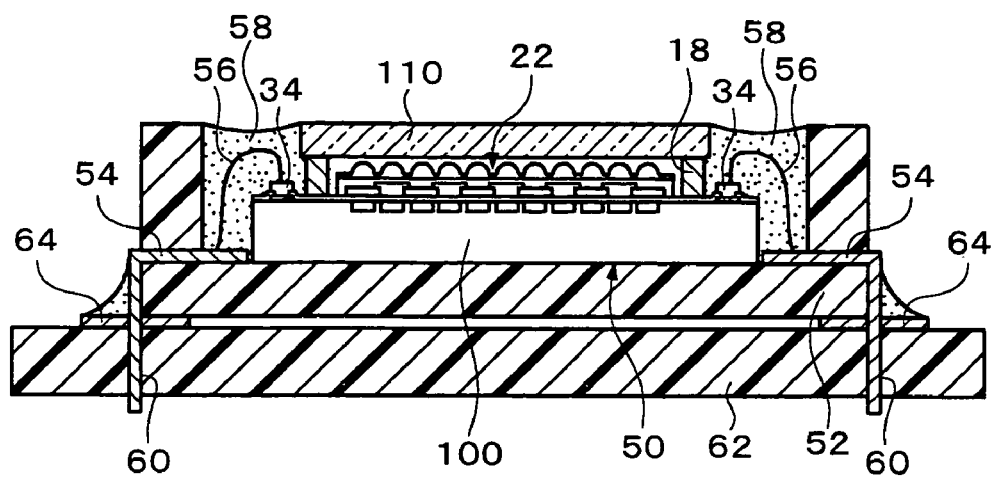
FIG. 12 is a diagram for illustrating the optical module and circuit board according to a fifth embodiment of the present invention.

FIG. 12 illustrates a fourth embodiment of the optical module and circuit board of the present invention. The optical module shown in FIG. 12 has the optical device 50 shown in FIG. 5A. The optical device 50 is attached to a support member (for example a case) 52. On the support member 52 connecting lines 54 are formed. The support member 52 may be a member not having the connecting lines 54. The support member 52 may be a Molded Interconnect Device (MID). The electrodes 34 of the optical device 50 and the connecting lines 54 are electrically connected. For the electrical connection, for example, wires 56 may be used. On the electrical connections (for example the wires 56 and the portions bonded thereof), a sealing material 58 is provided. That is to say, the electrical connections are sealed with the sealing material 58. The sealing material 58 may be provided, for example, by potting. Since the optical device 50 has the optical portion 22 sealed by the transparent substrate piece 110 and spacers 18, the sealing material 58 does not cover the optical portion 22. This is because the transparent substrate piece 110 and spacers 18 function as a dam with respect to the sealing material 58.

A part of the connecting lines 54 form external terminals (for example leads) 60. The external terminals 60 are electrically connected to a connecting line pattern 64 formed on a circuit board 62. In the example shown in FIG. 12, holes are formed in the circuit board 62, and the external terminals 60 are inserted into those holes. In the periphery of the holes, lands of the connecting line pattern 64 are formed, and these lands and the external terminals 60 are bonded by a soldering material (for example solder). Thus, the circuit board 62 has the optical module mounted.

Other Embodiments

Figure 13:
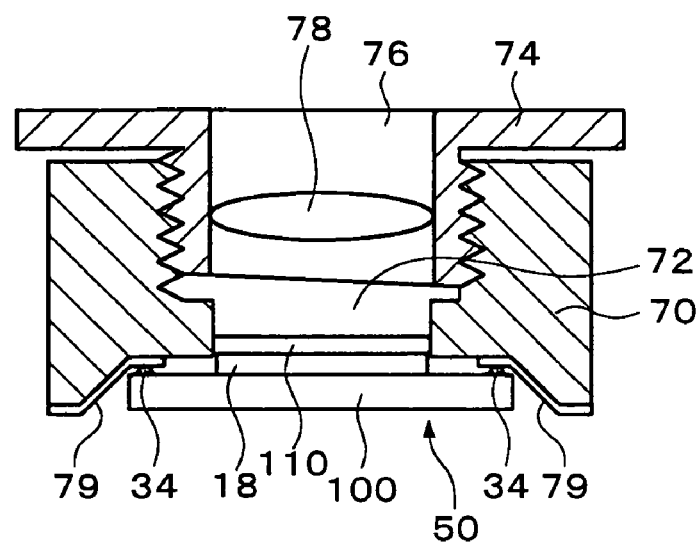
FIG. 13 is a diagram showing an optical module according to the embodiments of the present invention.

FIG. 13 illustrates an embodiment of the optical module of the present invention. The optical module shown in FIG. 13 has the optical device 50 shown in FIG. 5A, and a support member 70 attached to it. In the support member 70, a hole 72 is formed, and at least a portion of the transparent substrate piece 110 is positioned within the hole 72. In the hole 72 a lens holder 74 is attached. In the lens holder 74 also, a hole 76 is formed, and on the inside thereof, a lens 78 is mounted. The holes 76 and 72 are communicating, and light collected by the lens 78 impinges on the first substrate 10. It should be noted that the transparent substrate piece 110 may be such as to block light in the infrared region. For the bonding of the electrodes 34 of the optical device 50 and connecting lines 79 of the support member 70, any of an adhesive, anisotropic conducting material, anisotropic conducting film, or metal bonding may be applied. Between the optical device 50 and the support member 70, an underfill material not shown in the drawings may be provided.

Figure 14:
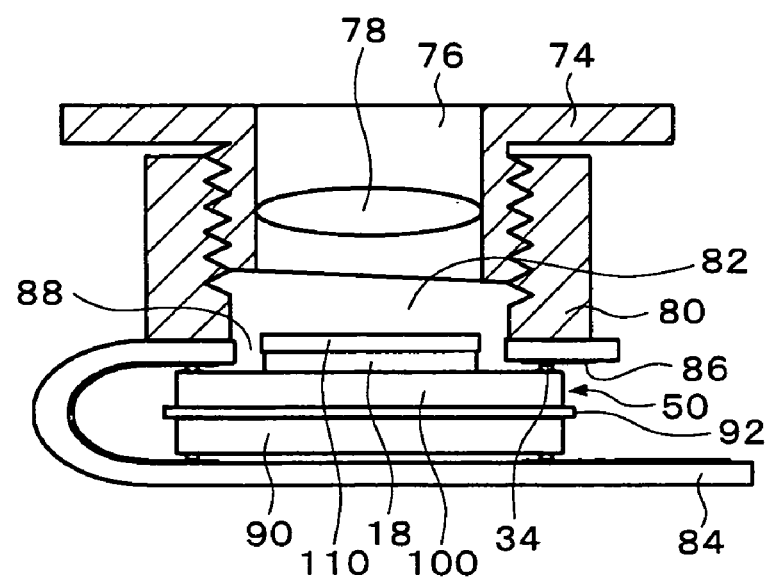
FIG. 14 is a diagram showing another optical module according to the embodiments of the present invention.

FIG. 14 illustrates an embodiment of the optical module of the present invention. The optical module shown in FIG. 14 has the optical device 50 shown in FIG. 5A and a support member 80 attached to it. In the support member 80 a hole 82 is formed, and at least a portion of the transparent substrate piece 110 is disposed within the hole 82. The lens holder 74 is mounted within the hole 82 (details as described above).

In FIG. 14, the optical device 50 is mounted on a substrate 84, and the electrodes 34 and a connecting line pattern 86 formed on the substrate 84 are bonded. For this bonding, any of an adhesive, anisotropic conducting material, anisotropic conducting film, or metal bonding may be applied. Between the optical device 50 and the substrate 84, an underfill material not shown in the drawings may be provided. In the substrate 84 also, a hole 88 is formed. The holes 76, 82, and 88 are communicating, and light collected by the lens 78 impinges on the first substrate 10.

On the substrate 84, an electronic component (for example a semiconductor chip) 90 is mounted (for example by face-down bonding). The electronic component 90 and connecting line pattern 86 are electrically connected. Additionally, a plurality of electronic components not shown in the drawings may be mounted. The substrate 84 is bent, and the electronic component 90 and optical device 50 are adhered, with an adhesive 92 interposed. It should be noted that the optical device 50 and electronic component 90 may be each previously mounted on the substrate 84, the substrate 84 bent, and the optical device 50 and electronic component 90 adhered.

Figure 15:
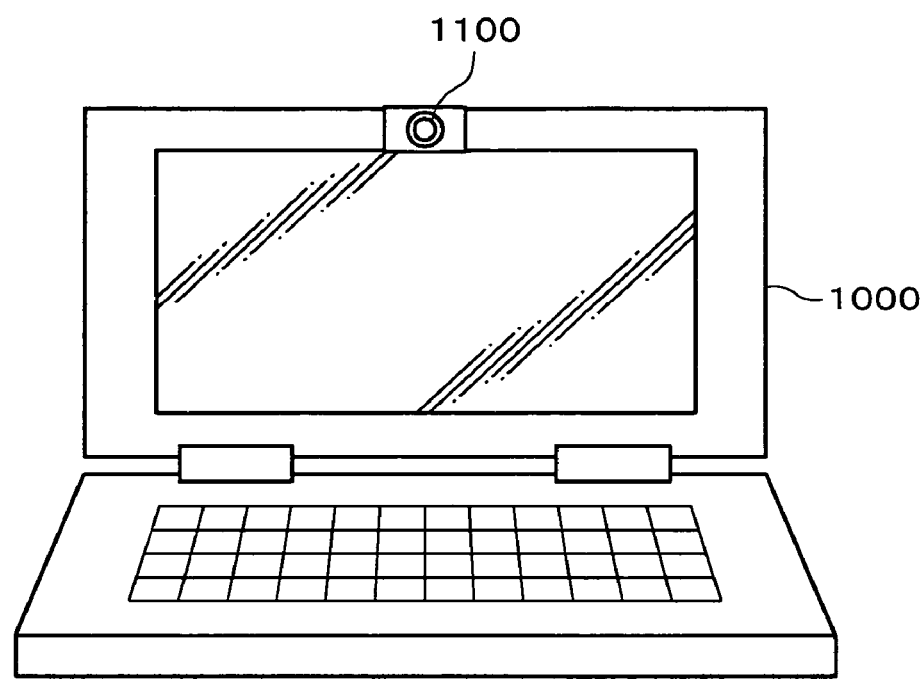
FIG. 15 is a diagram showing an electronic instrument according to the embodiments of the present invention.
Figure 16:
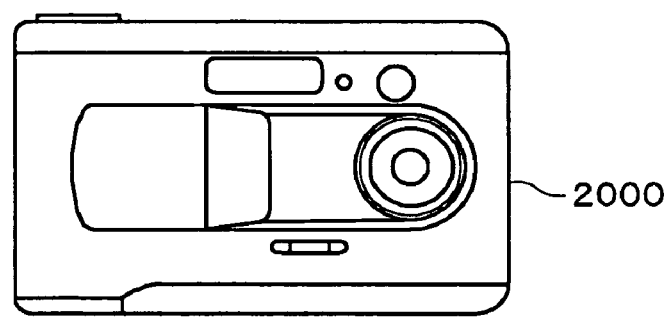
FIG. 16 is a diagram showing an electronic instrument according to the embodiments of the instrument of the present invention.
Figure 17A:
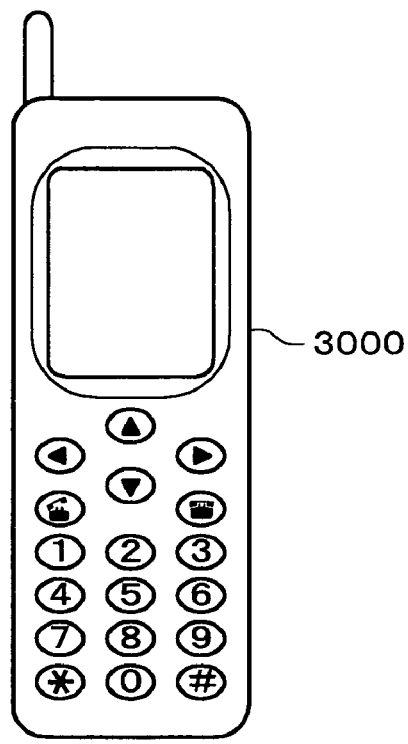
FIGS. 17A and 17B are diagrams showing an electronic instruments the embodiments of the electronic instrument of the present invention.
Figure 17B:
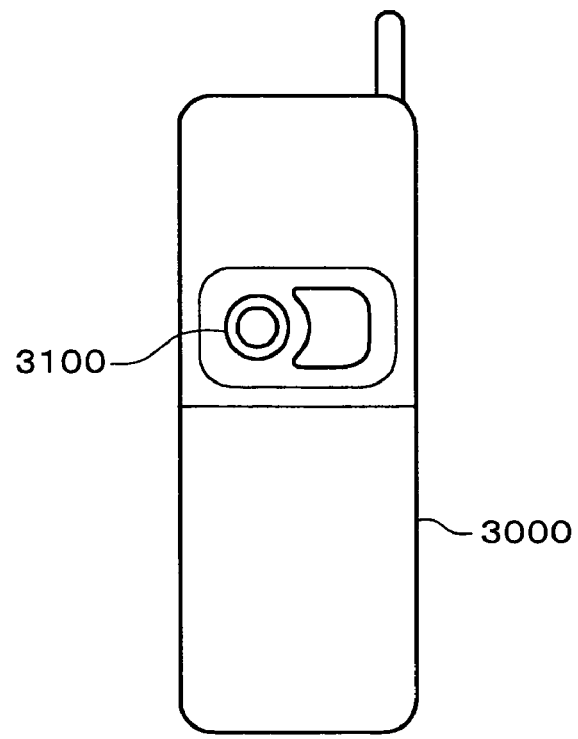

As an embodiment of the electronic instrument of the present invention, the notebook personal computer 1000 shown in FIG. 15 has a camera 1100 in which the optical module is incorporated. The digital camera 2000 shown in FIG. 16 has the optical module. Furthermore, the mobile telephone 3000 shown in FIGS. 17A and 17B has a camera 3100 incorporating the optical module.

What is claimed is:

1. A method of manufacturing an optical device comprising:
   (a) on at least one of a light transmitting first substrate and a second substrate which includes a first optical element having a first optical portion and a second optical element having a second optical portion, forming a first spacer in a form to surround the first optical portion, and then forming a second spacer in a form to surround the second optical portion;
   (b) sealing the first and second optical portions with the first substrate and the first and second spacers by connecting the first substrate to the second substrate with the first and second spacers interposed; and
   (c) cutting the second substrate to separate the first and second optical elements respectively having the first and second sealed optical portions.

2. The method of manufacturing an optical device as defined in claim 1, further comprising:
   cutting the first substrate in the step (c),
   wherein the first substrate is cut by a first cutter, and the second substrate is cut by a second cutter.

3. The method of manufacturing an optical device as defined in claim 2,
   wherein the width of the first cutter is larger than the width of the second cutter.

4. The method of manufacturing an optical device as defined in claim 2, wherein:
   the first substrate has a groove; and
   the first substrate is cut along the groove in the step (c).

5. The method of manufacturing an optical device as defined in claim 1, wherein:
   the first optical element has an electrode on the outside of the first optical portion, and the second optical element has an electrode on the outside of the second optical portion; and
   part of the first substrate located above the electrodes is removed by cutting the first substrate in the step (c).

6. The method of manufacturing an optical device as defined in claim 1, wherein:
   each of the first and second spacers has a thermosetting resin; and
   the first and second substrates are connected by heating the first and second spacers in the step (b).

7. The method of manufacturing an optical device as defined in claim 6, wherein:
   the first and second spacers are heated at a first temperature in the step (b); and
   the thermosetting resins are preliminarily cured by heating the first and second spacers at a second temperature which is lower than the first temperature before the step (b).

8. The method of manufacturing an optical device as defined in claim 1, wherein:
   each of the first and second spacers has a light curing resin; and the first and second substrates are connected by irradiating the first and second spacers with light in the step (b).

9. The method of manufacturing an optical device as defined in claim 8, wherein:
the first and second spacers are irradiated with light having a first energy in the step (b); and
the light curing resins are preliminarily cured by irradiating the first and second spacers with light having a second energy which is lower than the first energy before the step (b).

10. The method of manufacturing an optical device as defined in claim 1, wherein:
the first and second spacers are formed of a metal; and
the first and second spacers are soldered by the metal in the step (b).

11. The method of manufacturing an optical device as defined in claim 10,
wherein a soldering material is provided on a position on one of the first and second substrates opposite to the other of the first and second substrates to which one of the first and second spacers is attached, before carrying out the soldering.

12. The method of manufacturing an optical device as defined in claim 1,
wherein the first and second optical portions are sealed so that a space is formed between the first substrate and the first and second optical portions in the step (b).

13. The method of manufacturing an optical device as defined in claim 12,
wherein the first and second optical portions are sealed so that air in the space is evacuated in the step (b).

14. The method of manufacturing an optical device as defined in claim 12,
wherein the first and second optical portion are sealed so that the space is filled with nitrogen in the step (b).

15. The method of manufacturing an optical device as defined in claim 12,
wherein the first and second optical portion are sealed so that the space is filled with dry air in the step (b).

16. The method of manufacturing an optical device as defined in claim 1,
wherein the first substrate transmits at least visible light, and does not transmit infrared.

17. The method of manufacturing an optical device as defined in claim 1,
wherein the second substrate is a semiconductor wafer.

18. A method of manufacturing an optical device comprising:
(a) on at least one of a light transmitting first substrate and a second substrate which includes a plurality of optical elements each having an optical portion, forming a plurality of spacers in a form to respectively surround the optical portions by ejecting a material;
(b) sealing the optical portions with the first substrate and the spacers by connecting the first substrate to the second substrate with the spacers interposed; and
(c) cutting the second substrate to separate the optical elements respectively having the sealed optical portions.

19. The method of manufacturing an optical device as defined in claim 18,
wherein the material is ejected by a dispenser in the step (a).

20. The method of manufacturing an optical device as defined in claim 19, wherein:
the step (a) includes revolving a nozzle of the dispenser from a start point to an end point so as to surround each of the optical portions; and
of the material, a first portion provided at the start point and a second portion provided at the end point are spaced apart.

21. The method of manufacturing an optical device as defined in claim 18,
wherein the material is ejected by an inkjet method.

22. The method of manufacturing an optical device as defined in claim 18, wherein:
the spacers includes a first spacer and a second spacer; and
the first spacer is formed at first, and then the second spacer is formed in the step (a).

23. The method of manufacturing an optical device as defined in claim 18,
wherein the spacers are formed in a single operation with at least one of the first and second substrates in the step (a).

24. The method of manufacturing an optical device as defined in claim 18, further comprising:
cutting the first substrate in the step (c),
wherein the first substrate is cut by a first cutter, and the second substrate is cut by a second cutter.

25. The method of manufacturing an optical device as defined in claim 24,
wherein the width of the first cutter is larger than the width of the second cutter.

26. The method of manufacturing an optical device as defined in claim 24, wherein:
the first substrate has a groove; and
the first substrate is cut along the groove in the step (c).

27. The method of manufacturing an optical device as defined in claim 18, wherein:
the optical elements have electrodes on the outside of the optical portions; and
part of the first substrate located above the electrodes is removed by cutting the first substrate in the step (c).

28. The method of manufacturing an optical device as defined in claim 18, wherein:
each of the spacers has a thermosetting resin; and
the first and second substrates are connected by heating the spacers in the step (b).

29. The method of manufacturing an optical device as defined in claim 28, wherein:
the spacers are heated at a first temperature in the step (b); and
the thermosetting resins are preliminarily cured by heating the spacers at a second temperature which is lower than the first temperature before the step (b).

30. The method of manufacturing an optical device as defined in claim 18, wherein:
each of the spacers has a light curing resin; and
the first and second substrates are connected by irradiating the spacers with light in the step (b).

31. The method of manufacturing an optical device as defined in claim 30, wherein:
the spacers are irradiated with light having a first energy in the step (b); and
the light curing resins are preliminarily cured by irradiating the spacers with light having a second energy which is lower than the first energy before the step (b).

32. The method of manufacturing an optical device as defined in claim 18, wherein:
the spacers are formed of a metal; and
the spacers are soldered by the metal in the step (b).

33. The method of manufacturing an optical device as defined in claim 32,
wherein a soldering material is provided on a position on one of the first and second substrates opposite to the other of the first and second substrates to which one of the spacers is attached, before carrying out the soldering.

34. The method of manufacturing an optical device as defined in claim 18,
wherein the optical portions are sealed so that a space is formed between the first substrate and the optical portions in the step (b).

35. The method of manufacturing an optical device as defined in claim 34,
wherein the optical portions are sealed so that air in the space is evacuated in the step (b).

36. The method of manufacturing an optical device as defined in claim 34,
wherein the optical portion are sealed so that the space is filled with nitrogen in the step (b).

37. The method of manufacturing an optical device as defined in claim 34,
wherein the optical portion are sealed so that the space is filled with dry air in the step (b).

38. The method of manufacturing an optical device as defined in claim 18,
wherein the first substrate transmits at least visible light, and does not transmit infrared.

39. The method of manufacturing an optical device as defined in claim 18,
wherein the second substrate is a semiconductor wafer.

40. A method of manufacturing an optical device comprising:
(a) on at least one of a light transmitting first substrate and a second substrate which includes a plurality of optical elements each having an optical portion, forming a plurality of spacers in a form to respectively surround the optical portions by adhering a plurality of sheets;
(b) sealing the optical portions with the first substrate and the spacers by connecting the first substrate to the second substrate with the spacers interposed; and
(c) cutting the second substrate to separate the optical elements respectively having the sealed optical portions.

41. The method of manufacturing an optical device as defined in claim 40, wherein:
the sheets are fixed to a third substrate; and
the step (a) includes transferring the sheets from the third substrate to the first or second substrate.

42. The method of manufacturing an optical device as defined in claim 41,
wherein the third substrate is a light curing tape.

43. The method of manufacturing an optical device as defined in claim 40, further comprising:
cutting the first substrate in the step (c),
wherein the first substrate is cut by a first cutter, and the second substrate is cut by a second cutter.

44. The method of manufacturing an optical device as defined in claim 43,
wherein the width of the first cutter is larger than the width of the second cutter.

45. The method of manufacturing an optical device as defined in claim 40, wherein:
the optical elements have electrodes on the outside of the optical portions; and
part of the first substrate located above the electrodes is removed by cutting the first substrate in the step (c).

46. The method of manufacturing an optical device as defined in claim 43, wherein:
the first substrate has a groove; and
the first substrate is cut along the groove in the step (c).

47. The method of manufacturing an optical device as defined in claim 40, wherein:
each of the spacers has a thermosetting resin; and
the first and second substrates are connected by heating the spacers in the step (b).

48. The method of manufacturing an optical device as defined in claim 47, wherein:
the spacers are heated at a first temperature in the step (b); and
the thermosetting resins are preliminarily cured by heating the spacers at a second temperature which is lower than the first temperature before the step (b).

49. The method of manufacturing an optical device as defined in claim 40, wherein:
each of the spacers has a light curing resin; and
the first and second substrates are connected by irradiating the spacers with light in the step (b).

50. The method of manufacturing an optical device as defined in claim 49, wherein:
the spacers are irradiated with light having a first energy in the step (b); and
the light curing resins are preliminarily cured by irradiating the spacers with light having a second energy which is lower than the first energy before the step (b).

51. The method of manufacturing an optical device as defined in claim 40, wherein:
the spacers are formed of a metal; and
the spacers are soldered by the metal in the step (b).

52. The method of manufacturing an optical device as defined in claim 51,
wherein a soldering material is provided on a position on one of the first and second substrates opposite to the other of the first and second substrates to which one of the spacers is attached, before carrying out the soldering.

53. The method of manufacturing an optical device as defined in claim 40,
wherein the optical portions are sealed so that a space is formed between the first substrate and the optical portions in the step (b).

54. The method of manufacturing an optical device as defined in claim 53,
wherein the optical portions are sealed so that air in the space is evacuated in the step (b).

55. The method of manufacturing an optical device as defined in claim 53,
wherein the optical portion are sealed so that the space is filled with nitrogen in the step (b).

56. The method of manufacturing an optical device as defined in claim 53,
wherein the optical portion are sealed so that the space is filled with dry air in the step (b).

57. The method of manufacturing an optical device as defined in claim 40,
wherein the first substrate transmits at least visible light, and does not transmit infrared.

58. The method of manufacturing an optical device as defined in claim 40,
wherein the second substrate is a semiconductor wafer.

* * * * *